(12) United States Patent
Kojima et al.

(10) Patent No.: US 9,821,342 B2
(45) Date of Patent: Nov. 21, 2017

(54) ULTRASONIC SENSOR AND METHOD FOR PRODUCING THE SAME

(71) Applicant: Seiko Epson Corporation, Tokyo (JP)

(72) Inventors: Chikara Kojima, Matsumoto (JP); Koji Ohashi, Shiojiri (JP); Yoshinao Miyata, Omachi (JP)

(73) Assignee: Seiko Epson Corporation (JP)

( * ) Notice: Subject to any disclaimer, the term of this patent is extended or adjusted under 35 U.S.C. 154(b) by 407 days.

(21) Appl. No.: 14/582,304

(22) Filed: Dec. 24, 2014

(65) Prior Publication Data

US 2015/0187347 A1 Jul. 2, 2015

(30) Foreign Application Priority Data

Dec. 26, 2013 (JP) ................. 2013-270547

(51) Int. Cl.

| | |
|---|---|
| H01L 41/08 | (2006.01) |
| B06B 1/06 | (2006.01) |
| H01L 27/18 | (2006.01) |
| H01L 41/09 | (2006.01) |
| H01L 41/113 | (2006.01) |
| H01L 41/319 | (2013.01) |
| H01L 41/332 | (2013.01) |
| G01S 15/89 | (2006.01) |

(52) U.S. Cl.
CPC ........ *B06B 1/0629* (2013.01); *G01S 15/8915* (2013.01); *H01L 27/18* (2013.01); *H01L 41/0815* (2013.01); *H01L 41/0973* (2013.01); *H01L 41/1132* (2013.01); *H01L 41/319* (2013.01); *H01L 41/332* (2013.01)

(58) Field of Classification Search
CPC .............. B06B 1/0629; G01S 15/8915; H01L 418/0973; H01L 418/0815; H01L 418/319; H01L 418/332
See application file for complete search history.

(56) References Cited

U.S. PATENT DOCUMENTS

| | | | |
|---|---|---|---|
| 6,502,928 B1 * | 1/2003 | Shimada ............. | B41J 2/14233 347/68 |
| 7,948,155 B2 * | 5/2011 | Hishinuma ......... | B41J 2/14233 310/340 |

(Continued)

FOREIGN PATENT DOCUMENTS

JP 2010-164331 A 7/2010

*Primary Examiner* — J. San Martin
(74) *Attorney, Agent, or Firm* — Harness, Dickey & Pierce, P.L.C.

(57) ABSTRACT

Provided is an ultrasonic sensor including a piezoelectric elements arranged along a first direction and a second direction on a vibration plate, an insulation layer, and conductive lines. Each piezoelectric element including a first electrode, a piezoelectric layer, and a second electrode. The first electrode is partially removed in a regions between the piezoelectric elements. The second electrode is a separate electrode provided for each piezoelectric element. The insulation layer covers the second electrodes and has holes through which portions at opposite ends of the second electrodes along the first direction are partially exposed. Each conductive line is provided between adjacent ones of the second electrodes along the first direction and electrically connects, via the holes, the adjacent ones of the second electrodes.

5 Claims, 8 Drawing Sheets

(56) References Cited

U.S. PATENT DOCUMENTS

| | | | |
|---|---|---|---|
| 9,401,471 B2* | 7/2016 | Mizukami | B41J 2/14233 |
| 2004/0085410 A1* | 5/2004 | Miyata | B41J 2/161 |
| | | | 347/68 |
| 2005/0046678 A1* | 3/2005 | Owaki | B41J 2/14233 |
| | | | 347/68 |
| 2008/0238261 A1* | 10/2008 | Ohashi | H01L 41/0533 |
| | | | 310/340 |
| 2009/0207213 A1* | 8/2009 | Tsuda | B41J 2/055 |
| | | | 347/70 |
| 2013/0162726 A1* | 6/2013 | Mizukami | B41J 2/14233 |
| | | | 347/70 |
| 2014/0267506 A1* | 9/2014 | Ohnishi | B41J 2/14201 |
| | | | 347/68 |
| 2015/0258573 A1* | 9/2015 | Kojima | G10K 11/002 |
| | | | 310/327 |
| 2016/0089111 A1* | 3/2016 | Yamada | A61B 8/4494 |
| | | | 600/459 |

* cited by examiner

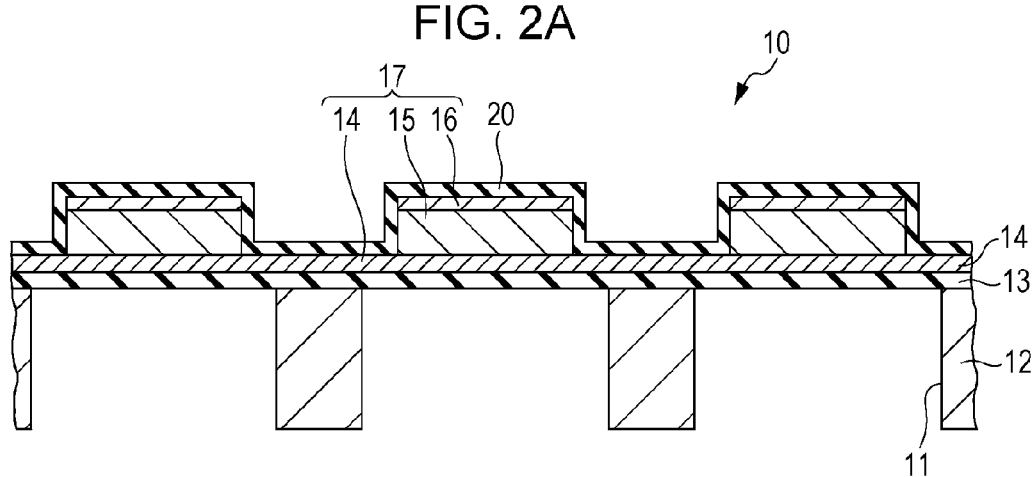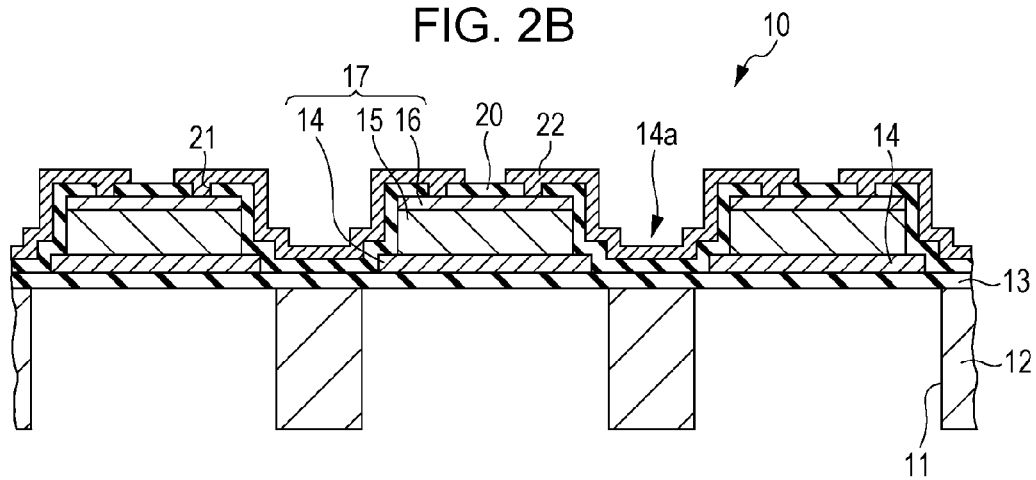

ULTRASONIC SENSOR AND METHOD FOR PRODUCING THE SAME

BACKGROUND

1. Technical Field

The present invention relates to an ultrasonic sensor and a method for producing the ultrasonic sensor.

2. Related Art

There has been known an ultrasonic sensor which includes: a semiconductor substrate having openings; and elements each of which is constituted by two layers of electrodes on an insulation layer provided on a surface of the semiconductor substrate so as to close the opening and a thin PZT ceramic layer sandwiched between the electrodes, and which are arranged in an array (for example, refer to JP-A-2010-164331).

In such an ultrasonic sensor in which the elements are arranged in an array, in order for first electrodes and second electrodes to be led out of the elements, particularly, in order for the second electrodes to be led out of the elements, it is necessary that the electrodes be common to the elements. However, if an active part is provided in an area other than the openings, sending and receiving cannot be carried out efficiently, and this leads to decreased reliability.

SUMMARY

An advantage of some aspects of the invention is to provide: a highly reliable ultrasonic sensor in which lines are led out in an efficient manner from elements arranged in an array; and a method for producing the ultrasonic sensor.

According to an aspect of the invention, there is provided an ultrasonic sensor. The ultrasonic sensor includes: a substrate having openings; a vibration plate provided on the substrate and closing the openings; and piezoelectric elements arranged along a first direction and a second direction, each piezoelectric element including a first electrode, a piezoelectric layer, and a second electrode which are stacked on a surface of the vibration plate opposite a corresponding one of the openings. The first electrode is an electrode in which regions between the piezoelectric elements have been at least partially removed. The second electrode is a separate electrode provided for each piezoelectric element. The ultrasonic sensor includes: an insulation layer that covers the second electrodes and that has holes through which portions at opposite ends of each second electrode along the first direction are partially exposed; and conductive lines each of which is provided between adjacent ones of the second electrodes along the first direction and electrically connects, via the holes, the adjacent ones of the second electrodes.

According to this aspect of the invention, the second electrodes, which are separate electrodes, are electrically connected by the conductive lines provided on the insulation layer that covers the second electrodes and that has holes through which portions at the opposite ends of the second electrodes along the first direction are partially exposed. Therefore, it is possible to connect the second electrodes with a relatively simple structure without causing interference with the first electrode.

It is preferable that the insulation layer between the piezoelectric elements be in contact with the vibration plate. This makes it possible to unfailingly prevent a short circuit between the conductive lines and the first electrode.

It is preferable that the first electrode be divided into separate electrodes along the first direction and be continuous along the second direction. This makes it possible to unfailingly prevent a short circuit between the conductive lines and the first electrode.

According to another aspect of the invention, there is provided a method for producing an ultrasonic sensor including: a substrate having openings; a vibration plate provided on the substrate and closing the openings; and piezoelectric elements arranged along a first direction and a second direction, each piezoelectric element including a first electrode, a piezoelectric layer, and a second electrode which are stacked on a surface of the vibration plate opposite a corresponding one of the openings. The method preferably includes: forming the first electrode, by forming a first film that is to become the first electrode and patterning the first film; forming the piezoelectric layer and the second electrode which are provided separately for each of the openings, by sequentially forming, on the first electrode, a second film that is to become the piezoelectric layers and a third film that is to become the second electrodes and patterning the second and third films; forming an insulation layer that has holes through which portions at opposite ends of each second electrode along the first direction are partially exposed, by forming an insulation film that covers the second electrodes and patterning the insulation film; and forming conductive lines each of which is provided between adjacent ones of the second electrodes along the first direction and electrically connects, via the holes, the adjacent ones of the second electrodes, by forming a fourth film that is to become the conductive lines and patterning the fourth film.

According to this aspect of the invention, the separately patterned second electrodes are covered with the insulation layer, and the conductive lines, each of which electrically connects adjacent ones of the second electrodes via the holes in the insulation layer, are provided. This makes it possible to connect the second electrodes together and relatively easily connect the second electrodes without causing interference with the first electrode.

It is preferable that the forming the first electrode include partially removing the first film in areas above which the conductive lines are to be provided. This makes it possible to unfailingly prevent a short circuit between the conductive lines and the first electrode when providing the conductive lines.

BRIEF DESCRIPTION OF THE DRAWINGS

The invention will be described with reference to the accompanying drawings, wherein like numbers reference like elements.

FIGS. 2A and 2B are cross-sectional views of the ultrasonic sensor of Embodiment 1.

DESCRIPTION OF EXEMPLARY EMBODIMENTS

Embodiment 1

Figure 1:
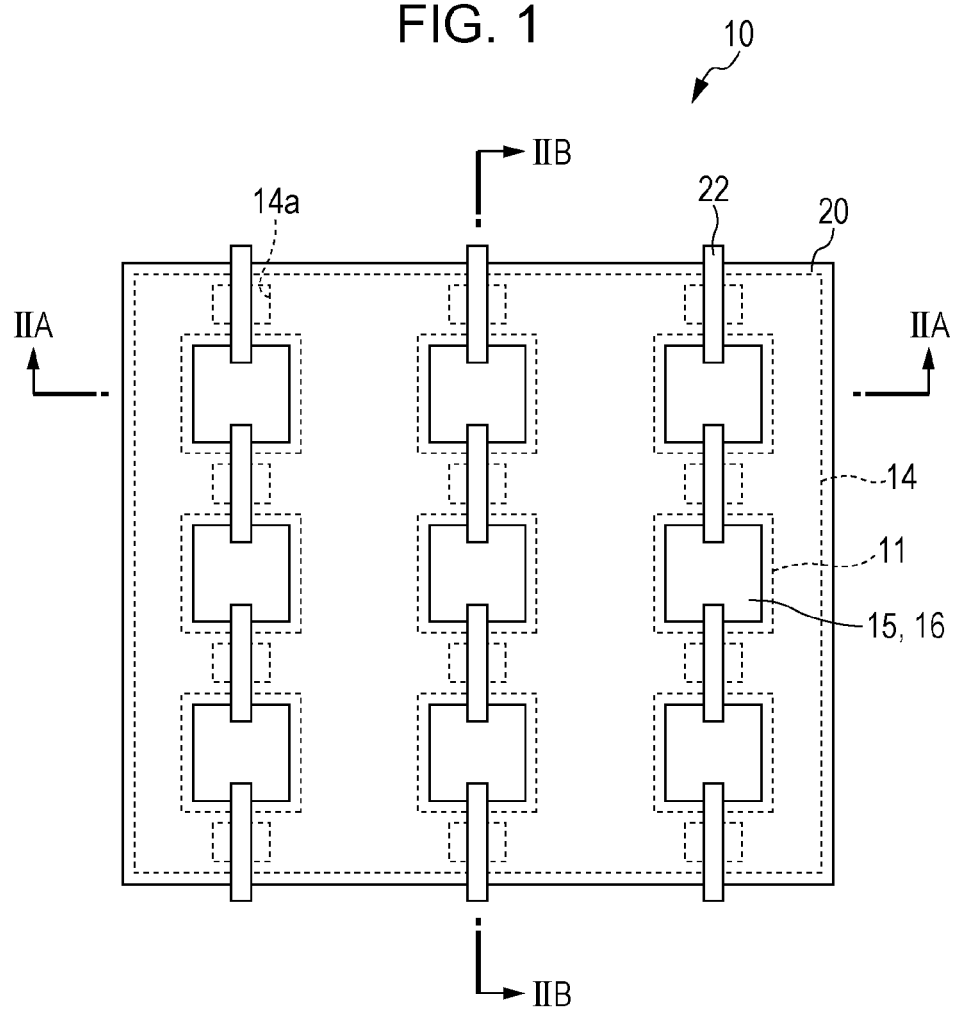
FIG. 1 is a plan view schematically illustrating a configuration of an ultrasonic sensor of Embodiment 1.

FIG. 1 is a plan view schematically illustrating a configuration of an ultrasonic sensor of Embodiment 1 of the invention. FIG. 2A is a cross-sectional view taken along line IIA-IIA of FIG. 1, and FIG. 2B is a cross-sectional view taken along line IIB-IIB of FIG. 1.

As illustrated in the drawings, an ultrasonic sensor 10 of the present embodiment includes: a substrate 12 which has openings 11; a vibration plate 13 provided on the substrate 12 so as to close the openings 11; and a piezoelectric element 17 including a first electrode 14, a piezoelectric layer 15, and a second electrode 16 which are stacked on a surface of the vibration plate 13 opposite a corresponding one of the openings 11.

The substrate 12 may be, for example, a silicon monocrystal substrate. The vibration plate 13 may be constituted by, for example, an elastic layer made of silicon dioxide and an insulation film (31 in FIGS. 8A to 8D etc.) made of zirconium oxide or the like. Note, however, that the insulation film is not essential.

On the vibration plate 13, the piezoelectric elements 17 are provided, via an adhesion layer if needed. The piezoelectric elements 17 are constituted by the first electrode 14, the piezoelectric layers 15 each of which is a thin film having a thickness of 3 μm or less, preferably 0.3 μm to 1.5 μm, and the second electrodes 16. It should be noted here that a piezoelectric element 17 refers to a portion including a first electrode 14, a piezoelectric layer 15, and a second electrode 16.

In general, a piezoelectric element 17 is configured such that: one of its electrodes is part of a common electrode; and the other of the electrodes and a piezoelectric layer 15 are those which are formed by patterning for each opening 11. Therefore, in the case where the ultrasonic sensor 10 is provided to have ultrasonic sensor elements in a one-dimensional or two-dimensional parallel array thereon, the ultrasonic sensor 10 may be configured such that, for example: the first electrode 14 is a common electrode shared by the piezoelectric elements 17; and the second electrode 16 is a separate electrode provided for each piezoelectric element 17. The present embodiment employs this configuration.

Here, the combination of the piezoelectric elements 17 and the vibration plate 13 which is to undergo a displacement in response to the driving of the piezoelectric elements 17 is referred to as an actuator device. In the above-referenced example, (i) the vibration plate 13, (ii) an insulation film and an adhesion layer (32 in FIGS. 8A to 8D etc.) provided according to need, and (iii) the first electrode 14 serve as a vibration plate. Note, however, that this does not imply any limitation. For example, the vibration plate 13 may be omitted, and the piezoelectric elements 17 themselves may also substantially serve as a vibration plate.

The first electrode 14 and the second electrodes 16 are not limited to a particular kind, provided that they are electrically conductive. Examples of the materials for the first electrode 14 and the second electrodes 16 include: metallic materials such as platinum (Pt), iridium (Ir), gold (Au), aluminum (Al), copper (Cu), titanium (Ti), and stainless steel; tin oxide-based conductive materials such as indium tin oxide (ITO) and fluorine-doped tin oxide (FTO); zinc oxide-based conductive materials; oxide conductive materials such as strontium ruthenate ($SrRuO_3$), lanthanum nickelate ($LaNiO_3$), and element-doped strontium titanate; and conductive polymers. Note, however, that the materials for the first electrode 14 and the second electrodes 16 are not limited to the above-listed materials.

A typical example of the material for the piezoelectric layers 15 is a lead-zirconate-titanate(PZT)-based complex oxide having a perovskite structure. This easily allows the piezoelectric elements 17 to make sufficient displacement.

Alternatively, the material for the piezoelectric layers 15 may be a lead-free complex oxide. For example, the material for the piezoelectric layers 15 may be a complex oxide having a perovskite structure which contains at least bismuth (Bi), barium (Ba), iron (Fe), and titanium (Ti). This achieves an ultrasonic sensor 10 made using an environmentally friendly lead-free material.

In such a perovskite structure, that is, in the $ABO_3$ structure, the A-site is in 12-fold coordination with oxygen, and the B-site is in 6-fold octahedral coordination with oxygen. In the case of the above-mentioned lead-free piezoelectric layers 15, Bi and Ba are located in the A-site and Fe and Ti are located in the B-site.

The composition formula of a complex oxide having a perovskite structure containing Bi, Ba, Fe, and Ti are represented as $(Bi,Ba)(Fe,Ti)O_3$. A typical composition of such a complex oxide is represented as a mixed crystal of bismuth ferrate and barium titanate. This mixed crystal means one from which bismuth ferrate alone or barium titanate alone cannot be detected in an X-ray diffraction pattern.

The complex oxide having a perovskite structure here also encompasses: those which have a non-stoichiometric composition due to missing or excessive element; and those in which at least one element is replaced with another element. That is, as long as the complex oxide can take a perovskite structure, not only the unavoidable non-stoichiometry of the composition due to mismatched lattices and/or the missing of oxygen etc., but also the replacement of some elements or the like are acceptable.

Furthermore, above-mentioned lead-free piezoelectric layers 15 may also contain other elements. For example, it is preferable that the above-mentioned lead-free piezoelectric layers 15 further contain manganese (Mn). This makes it easy to reduce leakage currents, and for example, as a lead-free material, this achieves a highly reliable ultrasonic sensor 10.

Bi in the A-site of the piezoelectric layers 15 may be replaced by lithium (Li), samarium (Sm), cerium (Ce), or the like. Fe in the B-site of the piezoelectric layers 15 may be replaced by aluminum (Al), cobalt (Co), or the like. This makes it easy to improve various properties and to achieve a wider variety of structures and functions. Also in the case of a complex oxide containing any of these other elements, the complex oxide is preferably structured so as to have a perovskite structure.

In the present embodiment, the first electrode 14 as a common electrode is a continuous layer, and the piezoelectric layers 15 and the second electrodes 16 are each provided separately so as to be disposed within an opening 11 when seen in plan view. In addition, an insulation layer 20 is provided as a continuous layer so as to cover the second electrodes 16. The insulation layer 20 has holes 21 through which the second electrodes 16 are exposed. The holes 21 are in positions corresponding to opposite ends of the second electrodes 16 along a first direction which is the vertical direction in FIG. 1. There are provided conductive lines 22 which are in electrical communication with the second electrodes 16 via the holes 21 and serve to electrically connect second electrodes 16 adjacent to each other along the first direction. The conductive lines 22 can be made from any conductive material. Examples of the material for the conductive lines 22 include gold, copper, and aluminum. In view of conductivity, gold is preferable.

It should be noted that, in the present embodiment, the first electrode 14 has been partially removed in areas between adjacent second electrodes 16 where the conductive lines 22 are provided (the removed parts are hereinafter referred to as removed parts 14*a*). In these areas, the conductive lines 22 face the vibration plate 13 via the insulation layer 20. Specifically, although the conductive lines 22 and the first electrode 14 are insulated from each other by the insulation layer 20 even without the removed parts 14*a*, for safety, the first electrode 14 has the removed parts 14*a* for the purpose of eliminating the possibility of a short circuit between the conductive lines and the first electrode 14. Note, however, that the removed parts 14*a* are not essential. There is no problem even without the removed parts 14*a*, because the conductive lines 22 and the first electrode 14 are insulated from each other by the insulation layer 20.

With such a configuration in which second electrodes 16 arranged along the first direction are connected via conductive lines 22 so that lines of the connected second electrodes 16 are arranged, it is possible to achieve relatively easily a structure in which voltages can be applied to all the piezoelectric elements 17 line by line.

Embodiment 2

Figure 3:
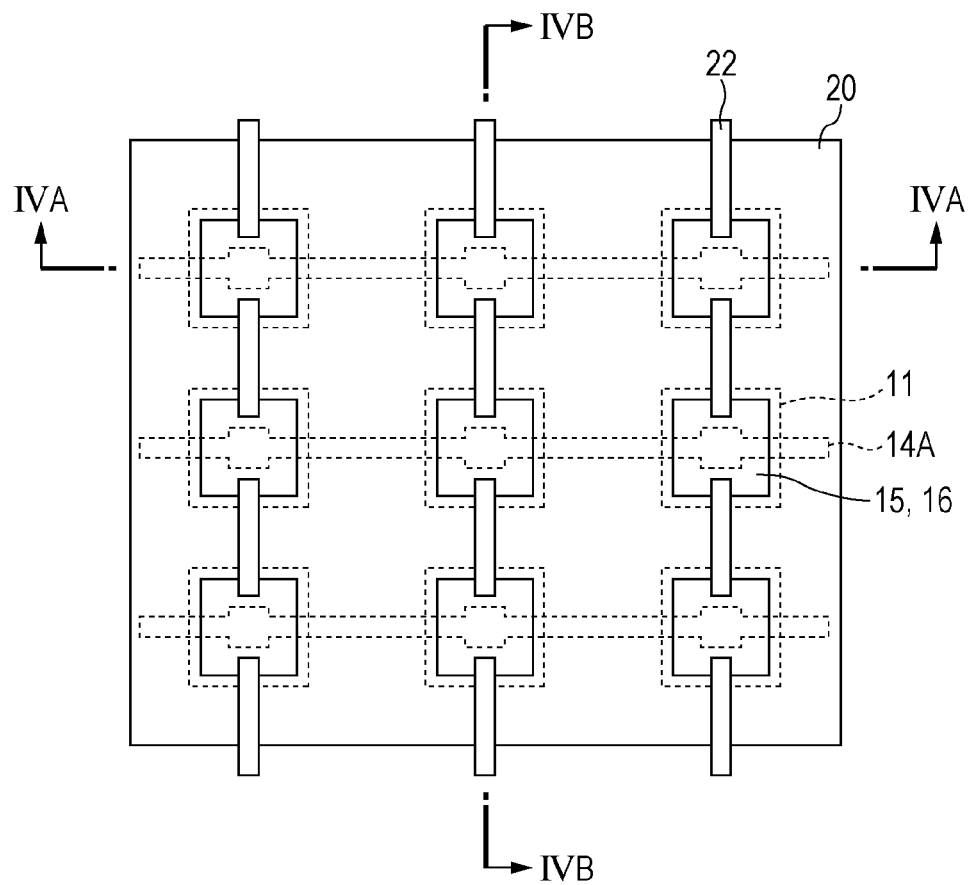
FIG. 3 is a plan view schematically illustrating a configuration of an ultrasonic sensor of Embodiment 2.
Figure 4A:
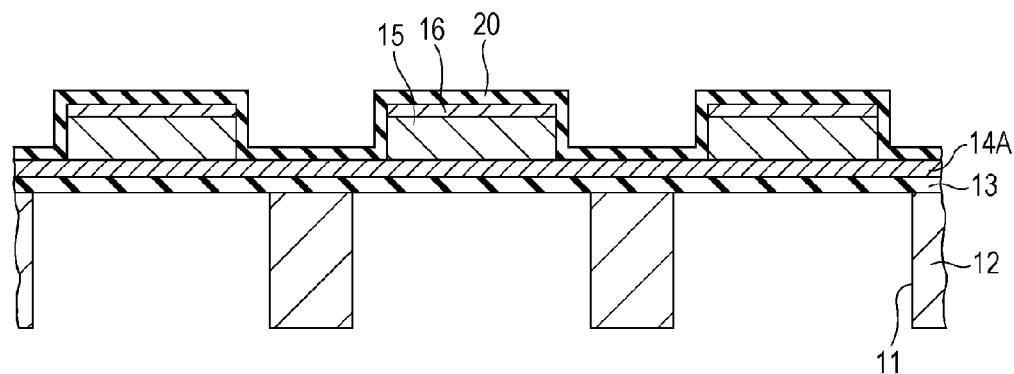
FIGS. 4A and 4B are cross-sectional views of the ultrasonic sensor of Embodiment 2.
Figure 4B:
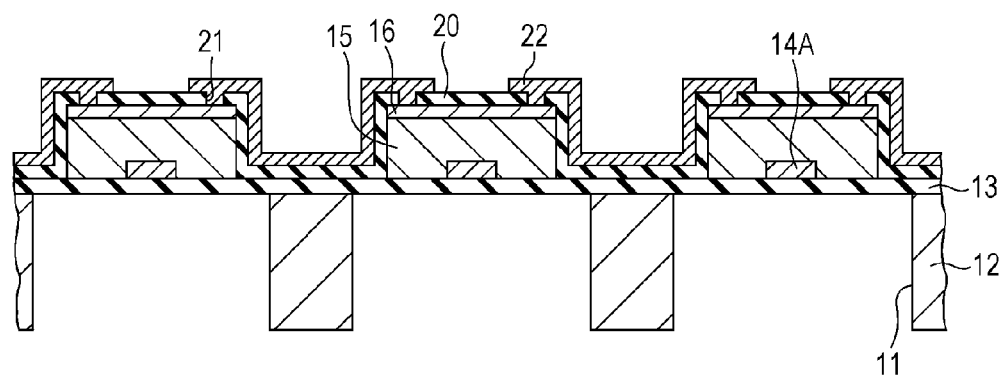

As illustrated in FIGS. 3, 4A and 4B, The present embodiment is similar to Embodiment 1, except that: each first electrode 14A is patterned so as to be disposed within an opening 11 when seen in plan view; and the first electrodes 14A are connected together along the second direction. Therefore, the same reference numerals are given to the same members, and detailed descriptions are omitted here.

Embodiments 3 to 5

Figure 5:
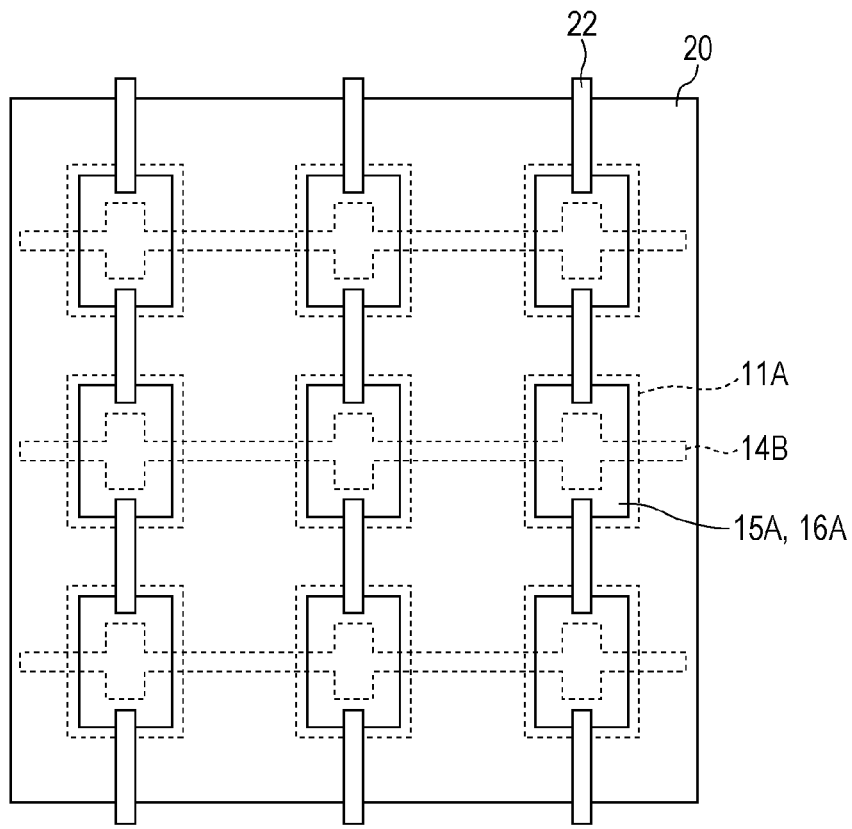
FIG. 5 is a plan view schematically illustrating a configuration of an ultrasonic sensor of Embodiment 3.
Figure 6:
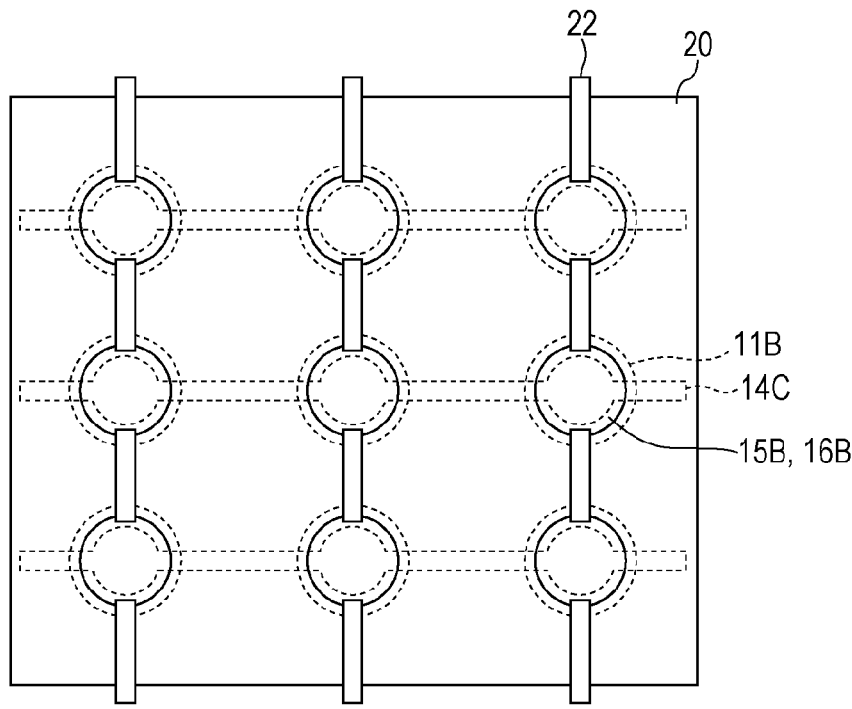
FIG. 6 is a plan view schematically illustrating a configuration of an ultrasonic sensor of Embodiment 4.
Figure 7:
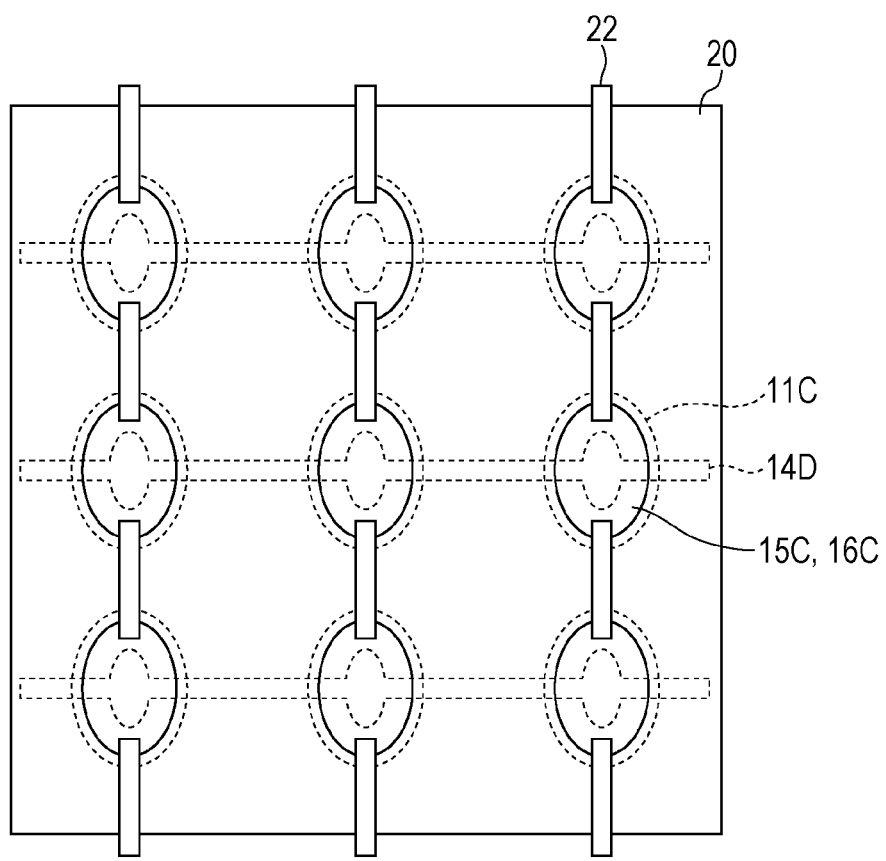
FIG. 7 is a plan view schematically illustrating a configuration of an ultrasonic sensor of Embodiment 5.

In the above-described embodiments, the shape of the opening 11 when seen in plan view is substantially square. Note, however, that the shape of the opening is not limited to such. The opening may be a rectangular opening 11A as illustrated in FIG. 5, a circular opening 11B as illustrated in FIG. 6, or an oval opening 11C as illustrated in FIG. 7. Furthermore, although the first and second electrodes are preferably patterned into the shape of an opening in view of allowing a large displacement along the thickness direction, the shapes of the electrodes are not limited to such. In Embodiments 3 to 5, the shapes are as follows: a rectangular first electrode 14B, a rectangular piezoelectric layer 15A, and a rectangular second electrode 16A; a circular first electrode 14C, a circular piezoelectric layer 15B, and a circular second electrode 16B; and an oval first electrode 14D, an oval piezoelectric layer 15C, and an oval second electrode 16C.

Next, the following description discusses an example of a method for producing an ultrasonic sensor of Embodiment 1, with reference to FIGS. 8A to 8D and FIGS. 9A to 9D. FIGS. 8A to 8D and FIGS. 9A to 9D are cross-sectional views showing an example of producing an ultrasonic sensor. FIGS. 8A to 8D and FIGS. 9A to 9D correspond to part of the cross-sectional view taken along line IIB-IIB of FIG. 1.

Figure 8A:
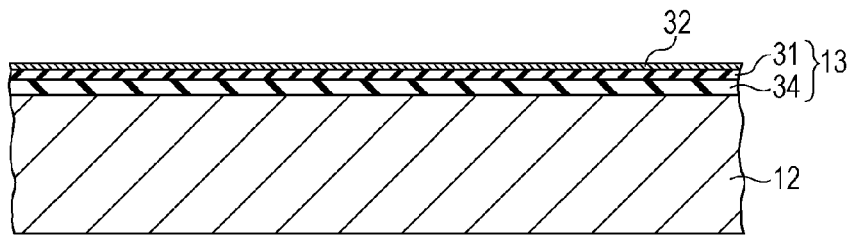
FIGS. 8A to 8D illustrate an example of producing the ultrasonic sensor of Embodiment 1.

First, referring to FIG. 8A, a substrate 12 is subjected to thermal oxidization or the like to produce a silicon oxide film (an elastic layer) 34 thereon. On the silicon oxide film, a film of zirconium is formed and thermally oxidized in, for example, a 500° C. to 1200° C. diffusion furnace to form an insulation film 31 made of zirconium oxide. The silicon oxide film and the insulation film 31 serve as a vibration plate 13. Then, on the vibration plate 13, an adhesion layer 32 made of titanium oxide or titanium is formed by sputtering, thermal oxidation, or the like.

Figure 8B:
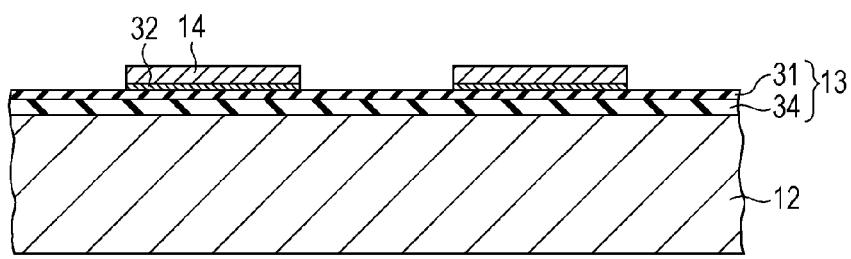

Then, referring to FIG. 8B, a first electrode 14 is formed on the adhesion layer 32 by sputtering, vapor deposition, or the like. The adhesion layer 32 and the first electrode 14 are patterned at the same time into a predetermined shape.

Figure 8C:
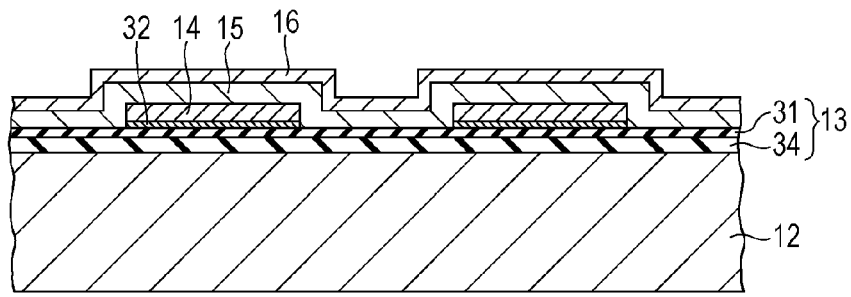

Next, referring to FIG. 8C, a piezoelectric layer 15 is formed on the first electrode 14. The piezoelectric layer 15 may be formed by, for example, CSD (chemical solution deposition). CSD is a method by which to obtain a piezoelectric material made of a metal oxide by: applying a solution prepared by dissolving or dispersing a metal complex in a solvent; drying the solution; and further baking the resultant material at high temperature. It should be noted that the method of forming the piezoelectric layer 15 is not limited to CSD. The piezoelectric layer 15 may also be formed by, for example, the sol-gel process, laser ablation, sputtering, pulse laser deposition (PLD), CVD, aerosol deposition, or the like. On the piezoelectric layer 15, a second electrode 16 is further formed by sputtering, thermal oxidation, or the like.

Figure 8D:
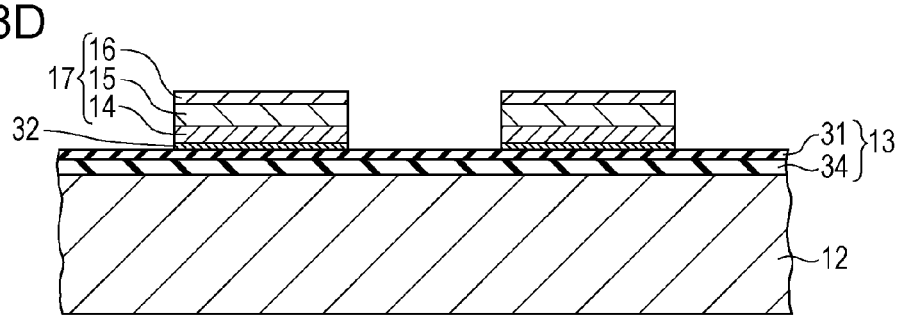

Subsequently, referring to FIG. 8D, the piezoelectric layer 15 and the second electrode 16 are patterned, whereby piezoelectric elements 17, each of which includes part of the first electrode 14, a piezoelectric layer 15, and a second electrode 16, are formed.

Figure 9A:
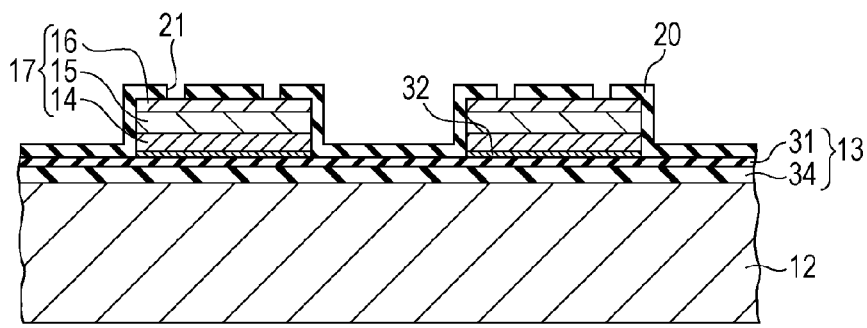
FIGS. 9A to 9D illustrate the example of producing the ultrasonic sensor of Embodiment 1.

Next, referring to FIG. 9A, an insulation layer 20 made of aluminum oxide etc. is formed. The insulation layer is patterned, whereby holes 21 are made in positions corresponding to opposite ends of each second electrode 16.

Figure 9B:
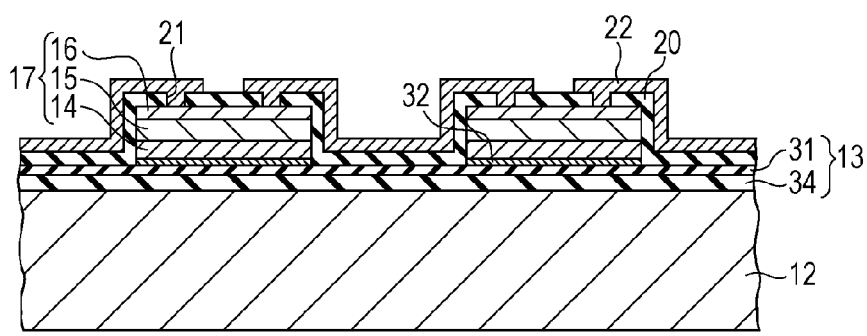

Next, referring to FIG. 9B, an adhesion layer made of nickel-chromium steel etc. and a layer of gold are formed and patterned, whereby conductive lines 22 are formed.

Figure 9C:
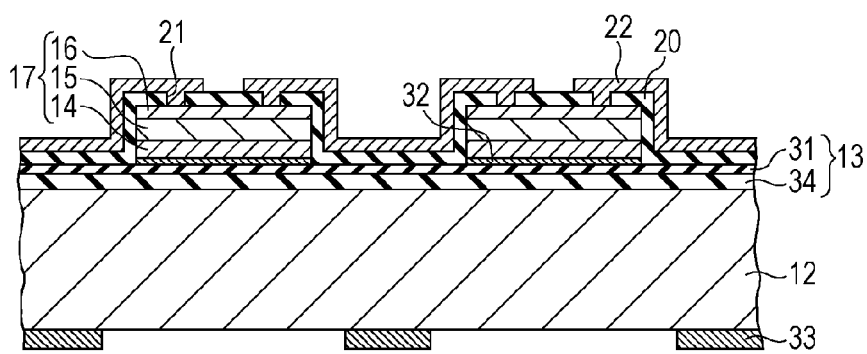
Figure 9D:
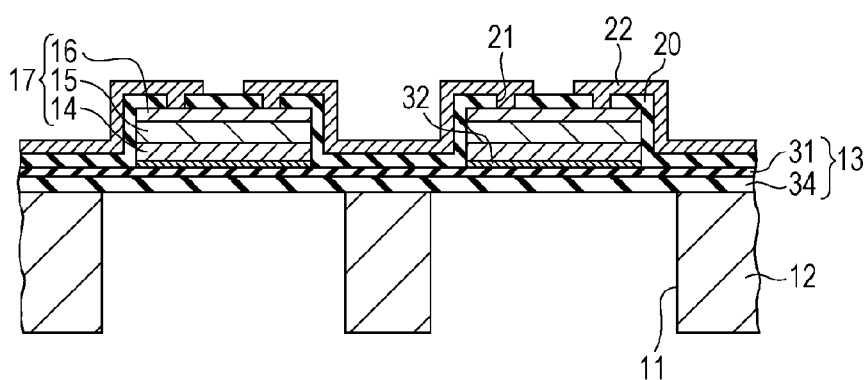

Next, referring to FIG. 9C, a mask film 33 is formed around the entire substrate 12. Next, referring to FIG. 9D, the substrate 12 is subjected to anisotropic etching (wet etching) via the mask film 33 with the use of an alkaline solution containing KOH etc., whereby the substrate 12 is partially removed so that the removed areas correspond to the piezoelectric elements 17. In this way, openings 11 are made.

Other Embodiments

The above-described embodiments employ a configuration in which a surface of the vibration plate 13 opposite the piezoelectric elements 17 serves as a region through which ultrasonic waves are sent toward a target and ultrasonic waves (echo signals) reflected by the target are received. With this configuration, since the surface of the vibration plate 13 opposite the piezoelectric elements 17 has a simple structure, it is possible to ensure a region that transmits well ultrasonic waves etc. Furthermore, since electrical parts including electrodes and lines and bonded portions of various members are kept away from a target, leakage currents are more easily prevented, and contamination is more easily prevented between these parts/portions and the target. Therefore, the ultrasonic sensor is also suitably applicable to medical instruments particularly sensitive to contamination and leakage currents, such as ultrasonic diagnostic instruments, blood pressure manometers, and tonometers.

It should be noted that, generally, the openings 11 etc. in the substrate 12 are filled with a resin that serves as an acoustic matching layer, such as silicone oil, silicone resin, or silicone rubber, and are sealed with a lens member that transmits ultrasonic waves etc. With this configuration, the difference in acoustic impedance between the piezoelectric elements 17 and a target is reduced, and ultrasonic waves are sent efficiently toward the target.

Furthermore, although not described in the above-mentioned embodiments, it is preferable to attach, to the substrate 12, an encapsulation plate to encapsulate a region including the piezoelectric elements 17. This physically protects the piezoelectric elements 17 and increases the strength of the ultrasonic sensor 10, and thus improves the structural stability. Moreover, in the case where the piezoelectric elements 17 are thin films, it is also possible to improve the handleability of the ultrasonic sensor 10 including such piezoelectric elements 17.

The entire disclosure of Japanese Patent

What is claimed is:

1. An ultrasonic sensor comprising:
   a substrate having openings;
   a vibration plate provided on the substrate and closing the openings;
   a plurality of piezoelectric elements independently arranged along a first direction and a second direction perpendicular to the first direction, the plurality of piezoelectric elements including first and second piezoelectric elements, each of the plurality of piezoelectric elements including:
      a first electrode that is provided on the vibration plate;
      a piezoelectric layer that is provided on the first electrode; and
      a second electrode that is provided on the piezoelectric layer so that the first electrode, the piezoelectric layer, and the second electrode are stacked on the vibration plate opposite a corresponding one of the openings,
      wherein the first electrode is continuous but for regions between the first and second piezoelectric elements in a plan view, and the second electrodes are provided in one-to-one correspondence with each of the plurality of piezoelectric elements;
   an insulation layer that covers the second electrodes, the insulation layer on the second electrode of the first piezoelectric element having first and second holes exposing the second electrode, the insulation layer on the second electrode of the second piezoelectric element having third and fourth holes exposing the second electrode, the first, second, third and fourth holes being provided along the first direction, the second hole being located closer to the third hole than the fourth hole; and
   a conductive line which is provided between the second electrode of the first piezoelectric element and the second electrode of the second piezoelectric element along the first direction, the conductive line being electrically connected to the second electrodes of the first and second piezoelectric elements only via the second and third holes.

2. The ultrasonic sensor according to claim 1, wherein the insulation layer between the first and second piezoelectric elements is in contact with the vibration plate.

3. The ultrasonic sensor according to claim 1, wherein the first electrodes are individually provided along the first direction, and the first electrodes are continuously provided along the second direction as a monolithic layer.

4. A method for producing an ultrasonic sensor, the ultrasonic sensor including:
   a substrate having openings;
   a vibration plate provided on the substrate and closing the openings; and
   a plurality of piezoelectric elements independently arranged along a first direction and a second direction perpendicular to the first direction, the plurality of piezoelectric elements including first and second piezoelectric elements, each of the plurality of piezoelectric elements including;
      a first electrode on the vibration plate;
      a piezoelectric layer on the first electrode; and
      a second electrode on the piezoelectric layer, wherein the first electrode, the piezoelectric layer, and the second electrode are stacked on the vibration plate opposite a corresponding one of the openings,
   the method comprising:
   forming a first film on the vibration plate;
   patterning the first film so as to form the first electrode of each of the plurality of piezoelectric elements, wherein the first electrode is continuous but for regions between the first and second piezoelectric elements in a plan view;
   continuously forming a second film and a third film on the first electrodes, the second and third films corresponding to the piezoelectric layer and the second electrode of each of the plurality of piezoelectric elements, respectively;
   patterning the second and third films so as to form the piezoelectric layer and the second electrode of each of the plurality of piezoelectric elements, wherein the piezoelectric layers and the second electrodes are provided in one-to-one correspondence with each of the plurality of piezoelectric elements;
   forming an insulation layer that covers the second electrodes;
   patterning the insulation layer so as to form first and second holes on the second electrode of the first piezoelectric element and third and fourth holes on the second electrode of the second piezoelectric element so that the second electrode exposes via the first, second, third, and fourth holes, wherein the first, second, third and fourth holes being provided along the first direction, the second hole being located closer to the third hole than the fourth hole;
   forming a conductive layer on the insulation layer so that the conductive layer contacts the second electrodes via the first, second, third, and fourth holes; and
   patterning the conductive layer so as to form a conductive line, the conductive line being provided between the second electrode of the first piezoelectric element and the second electrode of the second piezoelectric element along the first direction, the conductive line being electrically connected to the second electrodes of the first and second piezoelectric elements only via the second and third holes.

5. The method according to claim 4,
wherein the patterning the first film includes partially removing the first film that is designed to be located at a removing area, the removing area is located below a stacking layer of the insulation layer, and the piezoelectric layers and the second electrodes are spaced apart from the removing area in the plan view.

* * * * *